(12) United States Patent
Kawahata

(10) Patent No.: US 6,621,886 B2
(45) Date of Patent: Sep. 16, 2003

(54) SHIFT REGISTER HAVING FEWER LINES THEREIN, AND LIQUID CRYSTAL DISPLAY HAVING THE SAME

(75) Inventor: Ken Kawahata, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/038,181

(22) Filed: Oct. 23, 2001

(65) Prior Publication Data

US 2002/0097829 A1 Jul. 25, 2002

(30) Foreign Application Priority Data

Oct. 24, 2000 (JP) ........................................ 2000-323612

(51) Int. Cl.[7] ............................................. G06M 11/00
(52) U.S. Cl. ............................... 377/1; 377/54; 377/68; 377/78; 377/79
(58) Field of Search ................................ 377/1, 54, 68, 377/78, 79, 87; 345/104, 90, 92

(56) References Cited

U.S. PATENT DOCUMENTS 5,434,899 A  7/1995  Huq et al. ..................... 377/78
6,326,642 B1 * 12/2001  Yamazaki et al. ............. 257/59
6,339,631 B1 *  1/2002  Yeo et al. ..................... 377/64
6,424,012 B1 *  7/2002  Kawasaki et al. ............ 257/350

* cited by examiner

*Primary Examiner*—Margaret R. Wambach
(74) *Attorney, Agent, or Firm*—Brinks Hofer Gilson & Lione

(57) ABSTRACT

A shift register has m stages which store one of two states, where m is an integer more than 1, each stage including clock input terminals at which n-phase clock signals are input, where n is an integer more than 1, and an input terminal, and an output terminal. The input terminal of one stage receives the signal delivered from an input terminal of the shift register or from the output terminal of the previous stage. The signal output at the output terminal of one stage is passed to the input terminal of the subsequent stage or to an output terminal of the shift register. Each stage receives an initial state level from one of the clock input terminals. The initial state level is used to initialize the state of each stage.

20 Claims, 11 Drawing Sheets

|  | COMPARATIVE EXAMPLE | EMBODIMENT 1 | EMBODIMENT 2 | EMBODIMENT 3 |
|---|---|---|---|---|
| R (PER LINE) | 1200 Ω | 90 kΩ | 1200 Ω | 63 kΩ |
| C (PER LINE) | 860 pF | 11 pF | 860 pF | 16 pF |
| LINE WIDTH | 80 μm | ≪1 μm | 80 μm | ≪1 μm |
| LINE NUMBER | 4 (INCLUDING GND) | 3 | 3 | 2 |

# SHIFT REGISTER HAVING FEWER LINES THEREIN, AND LIQUID CRYSTAL DISPLAY HAVING THE SAME

BACKGROUND OF THE INVENTION

1. Field of the Invention

The present invention relates to a shift register and a device, such as a display or an image sensor, using the same.

2. Description of the Related Art

FIG. 14 is a circuit diagram which illustrates the internal circuitry of a stage F101 incorporated in a conventional exemplary shift register. The stage F101 includes an input terminal IN at which a signal $G_{i-1}$ output from a previous stage is input, an output terminal OUT at which a signal $G_i$ is output to a subsequent stage, clock input terminals $K_a$ and $K_b$ at which clock signals $\phi_a$ and $\phi_b$ are input, respectively, and a ground terminal GND connected to a ground potential.

FIG. 15 is an overall view of the conventional exemplary shift register. The shift register is formed of a plurality of stages F101, F102, F103, and the like. The internal circuitry of the stages F102, F103, and the like is the same as that of the stage F101 shown in FIG. 14. The stages F101, F102, F103, and the like are connected to each other in the cascade configuration. For example, the output terminal OUT of the stage F101 is connected to the input terminal IN of the next stage F102. As above described, the stages F102, F103, and the like have the same circuitry as the stage F101, and the stages F101, F102, F103, and the like each have ground terminals GND which are connected to the ground potential via a ground line. As used herein, ground potential refers to the initial state level of the internal components of the stages F101, F102, F103, and the like. That is, in the initial state, a ground potential is output from the output terminal OUT of each of the stages F101, F102, F103, and the like.

However, the conventional shift register has the following problems; it requires a line, such as a ground line, which supplies the initial state level to each stage in the shift register, so that the number of lines in the shift register increases, leading to an increase in size of the area required for wiring.

SUMMARY OF THE INVENTION

Accordingly, it is an object of the present invention to provide a shift register having fewer lines to reduce the size of area required for wiring, and to provide a display using the shift register.

To this end, in one aspect of the present invention, a shift register has m stages which store one of two states, where m is an integer more than 1, each stage including clock input terminals at which n-phase clock signals are input, where n is an integer more than 1, and an input terminal, and an output terminal. The input terminal of one stage receives the signal delivered from an input terminal of the shift register or from the output terminal of the previous stage. The signal output at the output terminal of one stage is passed to the input terminal of the subsequent stage or to an output terminal of the shift register. Each stage receives an initial state level from one of the clock input terminals. The initial state level is used to initialize the state of each stage.

Since the initial state level is input from one of the clock input terminals, a line, such as a ground line, which supplies the initial state level is eliminated. Therefore, fewer lines are connected to the shift register, thereby reducing the size of area required for wiring.

Two- to four-phase clock signals would provide optimum number of clock signal lines, thereby reducing the size of area required for wiring.

Preferably, the stages in the shift register are divided into a plurality of groups, and the in-phase clock input terminals of the stages in each group are all connected to each other.

This allows the clock input terminals of the stages in each group to be integrated into one system, and each group is provided with a set of clock input terminals. Thus, the clock signal lines in the shift register may not extend across the shift register. Therefore, the length of the clock signal lines in the shift register may be reduced, thereby reducing a delay of the clock signals due to the line capacitance or the line resistance.

Preferably, each stage further includes a storage unit for storing one of two states, and an initializing unit for initializing the state stored by the storage unit to the initial state level input from one of the clock input terminals.

The initializing unit (a transistor in an illustrated embodiment) may be used to initialize one of the two states, i.e., HIGH level or LOW level, which is stored in the storage unit (a capacitor in the illustrated embodiment) to the initial state level (the ground potential in the illustrated embodiment) which is input from one of the clock input terminals. Thus, a line, such as a ground line, which supplies the initial state level is not necessary in order to initialize the state of each stage in the shift register.

Preferably, the initializing unit is an MIS transistor, and MIS transistors contained in each stage, including that MIS transistor, are of the same channel type.

All of the MIS transistors are of the same channel type, thereby making the production process simplified. The MIS transistors of the same channel type would be achieved using multiphase clock signals.

Preferably, the MIS transistors are made of a material containing amorphous silicon or polycrystalline silicon.

When a voltage is applied in the same direction to a MIS transistor made of a material containing amorphous silicon or polycrystalline silicon, the reliability of the MIS transistor may be reduced in general. According to the present invention, however, the initial state level is input to the MIS transistor, or the initializing unit, from one of the clock input terminals having a time-varying potential, rather than a line having a potential which is always fixed at the initial state level. Thus, the direction of the voltage applied to the MIS transistor varies over time, and is not fixed to the same direction. Accordingly, the reliability of the MIS transistor is improved.

The outputs of the stages in the shift register may correspond to scan signals of an active matrix circuit having switching elements formed at intersections between signal lines and scan lines. Preferably, MIS transistors contained in the active matrix circuit, and the MIS transistors contained in each of the stages in the shift register are of the same channel type, and are made of a material containing amorphous silicon or polycrystalline silicon.

Since the outputs of the stages in the shift register correspond to scan signals of the active matrix circuit, that is, a gate driver or a source driver of the active matrix circuit is formed of the shift register, fewer lines are required for the gate driver or the source driver. The size of area required for the lines in the gate driver or the source driver is therefore reduced.

Preferably, the shift register is formed together with the active matrix circuit on the same substrate.

Since the shift register and the active matrix circuit formed on the same substrate, the line extending between the shift register and the active matrix circuit can be shortened. The MIS transistors which are formed on the same substrate may be formed using the same production process, and the MIS transistors in the shift register and the active matrix circuit may be of the same channel type, and may be made of the same material.

In another aspect of the present invention, a display uses the shift register in accordance with the present invention as a gate driver and/or a source driver.

Fewer lines are required for a shift register used as a gate driver and/or a source driver, thereby reducing the size of area required for wiring. This results in a compact display having a smaller wiring area than a conventional display without any influence on display capabilities.

DESCRIPTION OF THE PREFERRED EMBODIMENTS

Figure 1:
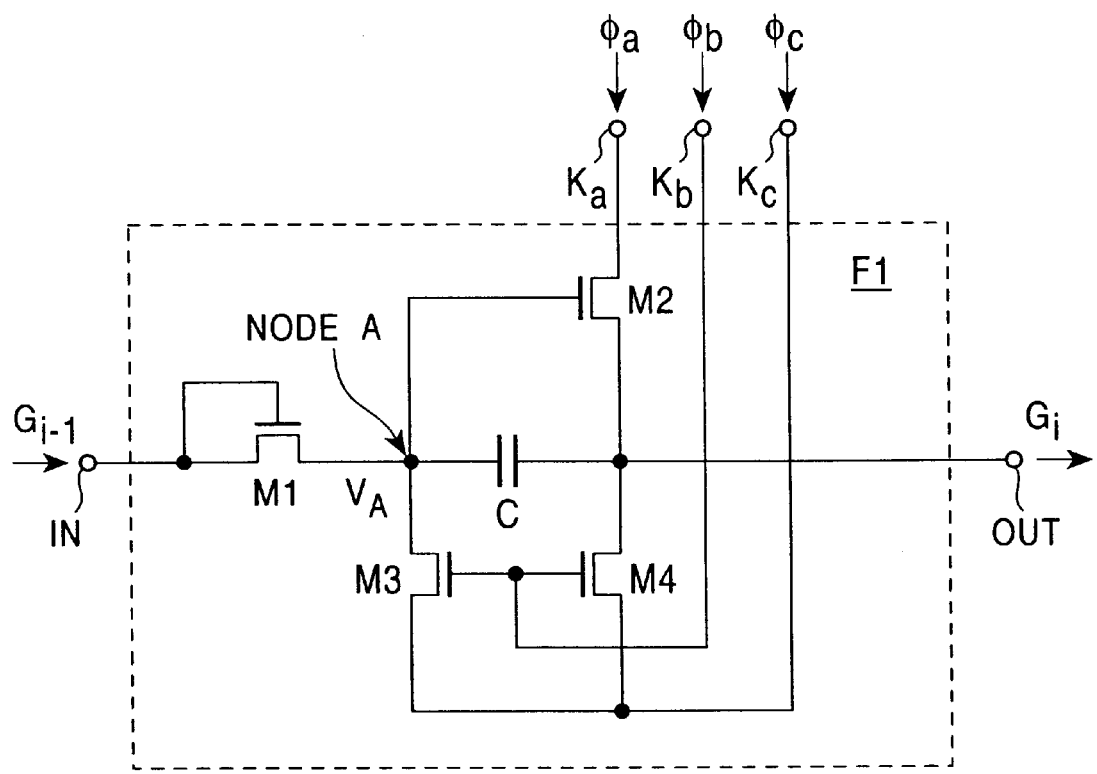
FIG. 1 is a circuit diagram which illustrates the internal circuitry of a stage F1 incorporated in a shift register according to a first embodiment of the present invention.

FIG. 1 is a circuit diagram which illustrates the internal circuitry of a stage F1 incorporated in a shift register according to a first embodiment of the present invention. The stage F1 includes an input terminal IN at which a signal $G_{i-1}$ output from a previous stage is input, an output terminal OUT at which a signal $G_i$ is output to a subsequent stage, and three clock input terminals $K_a$, $K_b$, and $K_c$ at which three-phase clock signals $\phi_a$, $\phi_b$, and $\phi_c$ are input, respectively.

The input terminal IN is connected to a first end (node A) of a capacitor C serving as a storage element via an MIS (metal-insulator-semiconductor) transistor M1 serving as a diode. A second end of the capacitor C is connected to the output terminal OUT. The clock input terminal $K_a$ is connected to the drain of an MIS transistor M2, the clock input terminal $K_b$ is connected to the gates of MIS transistors M3 and M4, and the clock input terminal $K_c$ is connected to the sources of the MIS transistors M3 and M4. The first end (node A) of the capacitor C is connected to the gate of the MIS transistor M2 and the drain of the MIS transistor M3. The second terminal of the capacitor C, i.e., the output terminal OUT, is connected to the source of the MIS transistor M2 and the drain of the MIS transistor M4.

Figure 2:
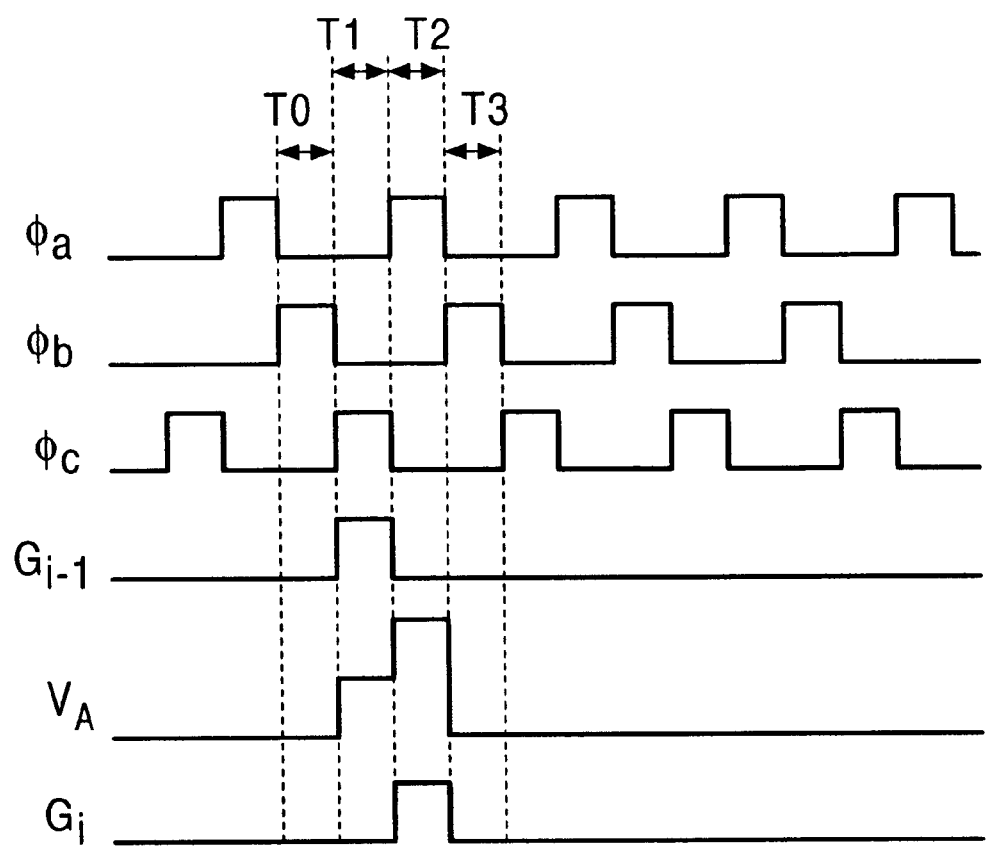
FIG. 2 is a timing chart of the stage F1 shown in FIG. 1.

FIG. 2 is a timing chart of the stage F1. The stage F1 retains the input signal $G_{i-1}$ input from the input terminal IN in the capacitor C used as a storage element, and outputs the output signal $G_i$ from the output terminal OUT.

In a period T0 of the timing chart, since the clock signal $\phi_b$ is at a high level (HIGH), the MIS transistors M3 and M4 are turned on. In turn, the first and second ends of the capacitor C are short-circuited, and the capacitor C would be discharged if it had been charged. Since the clock signal $\phi_c$ is at a low level (LOW) in the period T0, the MIS transistor M4 is turned on while the clock signal $\phi_c$ is LOW, so that the output signal $G_i$ goes LOW. Since the MIS transistor M3 is also turned on, the potential $V_A$ at the node A goes LOW, so that the MIS transistor M2 is turned off.

In the next period T1, the clock signal $\phi_b$ goes LOW, and the MIS transistors M3 and M4 are turned off. The clock signal $\phi_c$ is HIGH in the period T1, but has no influence on the potential $V_A$ and the output signal $G_i$ because the MIS transistors M3 and M4 are turned off. In this state, the input signal $G_{i-1}$ goes HIGH, and the potential $V_A$ also goes HIGH. As the potential $V_A$ goes HIGH, the MIS transistor M2 is turned on. Since the clock signal $\phi_a$ is LOW in the period T1, the output signal $G_i$ is also LOW. The output signal $G_i$ at the low level and the potential $V_A$ at the high level allow the capacitor C between the output signal $G_i$ and the potential $V_A$ to be charged. Then, the potential $V_A$ is fixed at the high level. This ensures that the MIS transistor M2 remains in the ON state.

In the next period T2, as the clock signal $\phi_a$ goes HIGH, the output signal $G_i$ also goes HIGH because the MIS transistor M2 is still ON. This causes the potential $V_A$ to be boosted (bootstrapped) to a potential that is substantially double the high level. Then, the ON state of the MIS transistor M2 is strengthened.

In the next period T3, the clock signal $\phi_b$ goes HIGH, and the MIS transistors M3 and M4 are turned on. Then, the first and second ends of the capacitor C are short-circuited, allowing the capacitor C that has been charged to be discharged. Since the clock signal $\phi_c$ is at the low level, the MIS transistor M4 is turned on while the clock signal $\phi_c$ is LOW, so that the output signal $G_i$ goes LOW again. Since the MIS transistor M3 is also turned on, the potential $V_A$ goes LOW, so that the MIS transistor M2 is turned off. Accordingly, without a ground line that is always kept at the low level (LOW) being connected to the stage F1, the signal $G_i$ output from the output terminal OUT is allowed to go LOW again.

Figure 3:
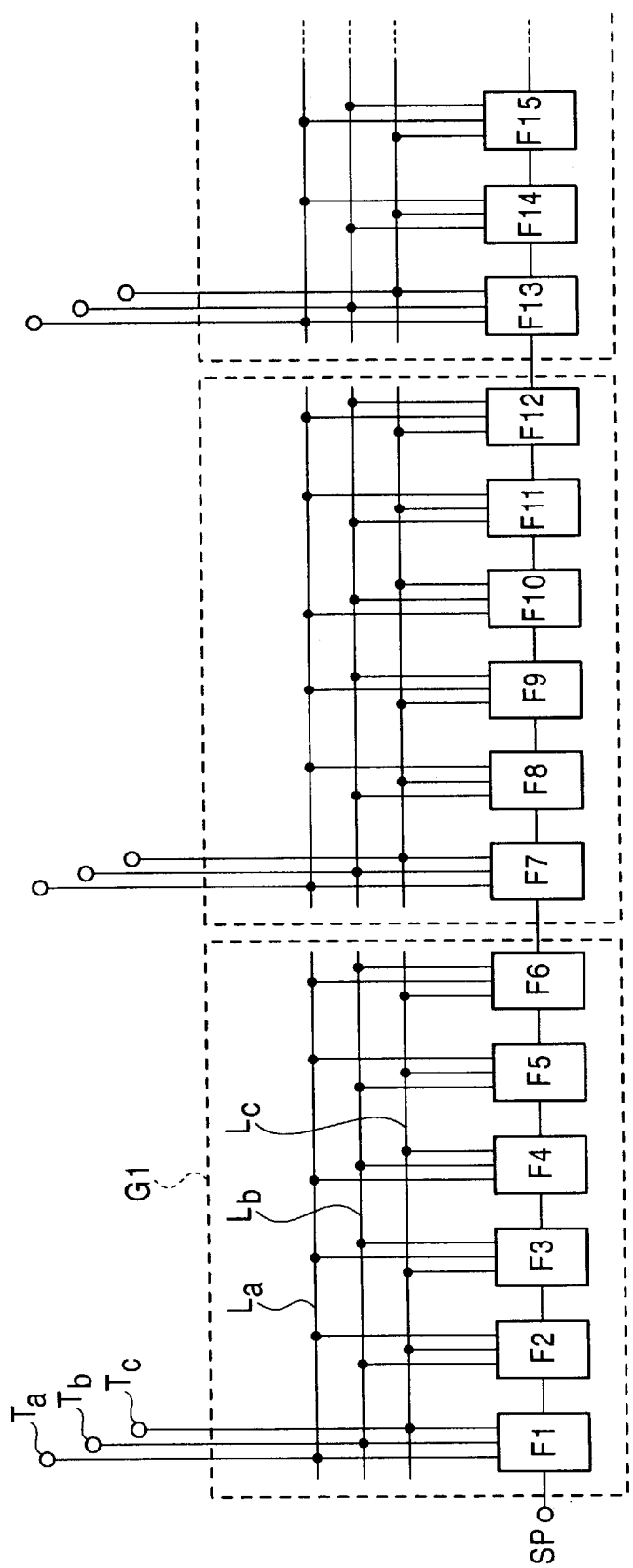
FIG. 3 is an overall view of the shift register according to the first embodiment.

FIG. 3 is an overall view of the shift register according to the first embodiment. The shift register is formed of a plurality of stages F1, F2, F3, and the like. The internal circuitry of the stages F2, F3, and the like is the same as that of the stage F1 shown in FIG. 1. The stages F1, F2, F3, and the like are connected to each other in the cascade configuration. For example, the output terminal OUT of the stage F1 is connected to the input terminal IN of the next stage F2.

A group is formed of six successive stages of the stages F1, F2, F3, and the like. For example, a group G1 is formed of the stages F1 to F6. The in-phase clock input terminals of the stages in one group are all connected to each other, and are then connected to three clock input terminals, respectively, a set of which is provided for that group. Specifically, the clock input terminals $K_a$, $K_b$, and $K_c$ of each of the stages F1 to F6 in the group G1 are connected to clock signal lines $L_a$, $L_b$, and $L_c$, respectively, and the clock signal lines $L_a$, $L_b$, and $L_c$ are connected to clock input terminals $T_a$, $T_b$, and $T_c$, respectively, a set of which is provided for the group G1. It is noted that the clock signal lines $L_a$, $L_b$, and $L_c$ are not connected to clock signal lines of another group. Therefore, clock signal lines of one group do not extend across the shift register.

Specifically, the clock signal lines of a group (for example, the clock signal lines $L_a$, $L_b$, and $L_c$ of the group G1) are formed on a TFT (thin film transistor) substrate (glass substrate), and provide great line resistance. On the other hand, the lines extending to a set of clock input terminals of a group (for example, the set of clock input terminals $T_a$, $T_b$, and $T_c$ of the group G1) are mounted on a TCP (tape carrier package), and may be made of a lower resistance material. This makes it possible to reduce a delay of the clock signals due to the line resistance.

Figure 4:
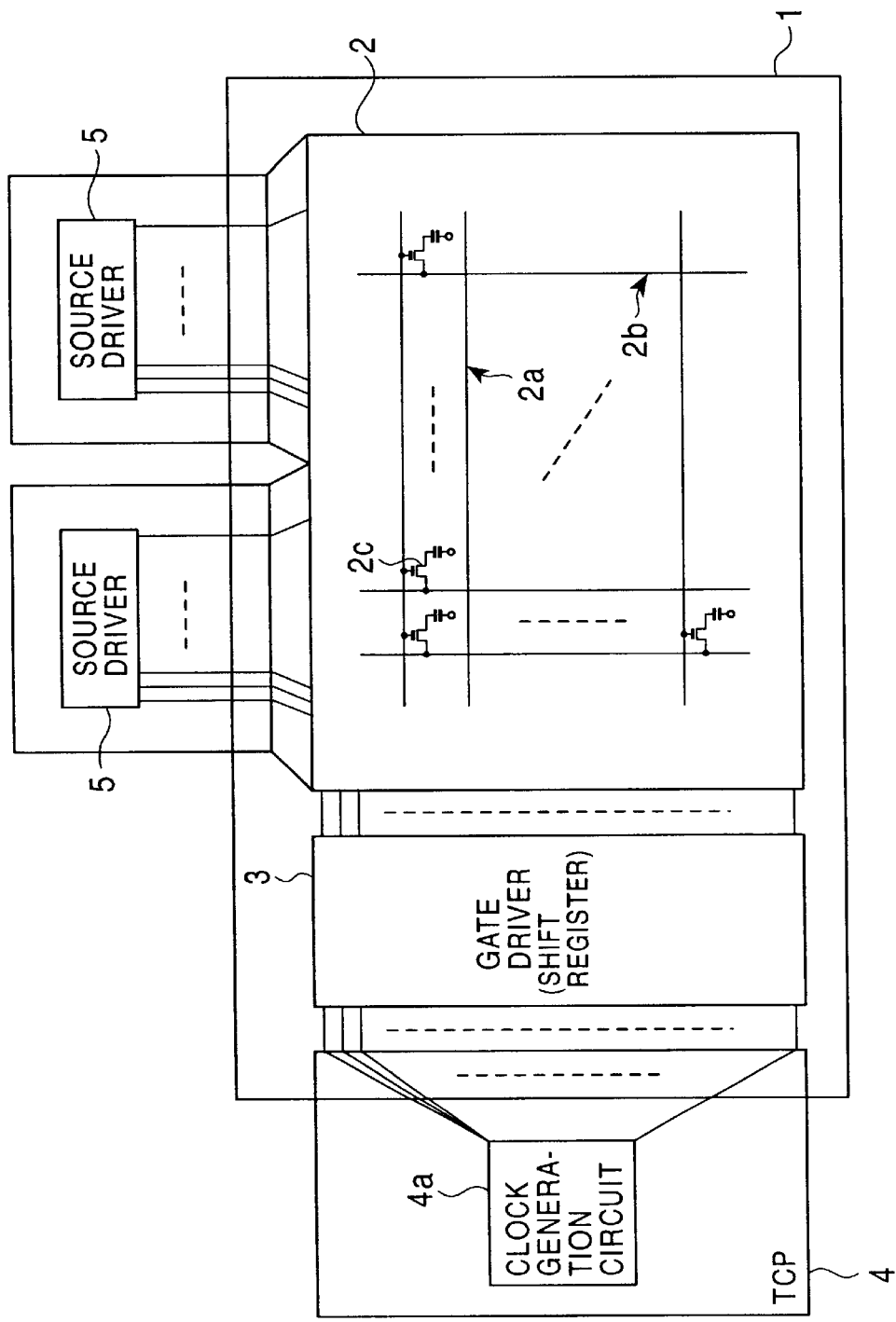
FIG. 4 is a schematic view of a display in an embodiment which uses the shift register in accordance with the first embodiment as a gate driver.

FIG. 4 is a schematic view of a display in one embodiment which uses the shift register in accordance with the first embodiment as a gate driver. The display includes a TFT substrate (glass substrate) 1, a display area 2 formed on the TFT substrate 1, and a gate driver (shift register) 3 positioned on a side of the display area 2 for driving scan lines 2a within the display area 2. That is, the display area 2 and the gate driver (shift register) 3 are formed on the same TFT substrate (glass substrate) 1 by the same production process. Therefore, MIS transistors 2c formed at intersections between the scan lines 2a and signals lines 2b within the display area 2, and the MIS transistors in the gate driver (shift register) 3 are of the same channel type (for example, n-channel transistors). The MIS transistors are made of the same material, and the MIS transistors formed on the glass substrate are preferably made of a material containing amorphous silicon or polycrystalline silicon.

If a voltage is always applied in the same direction across the gate and source of an MIS transistor which is made of a material containing amorphous silicon or polycrystalline silicon, the reliability of the MIS transistor may be reduced.

In the conventional shift register, the clock signal $\phi_b$ having a high level potential or a ground potential is input to the gates of the MIS transistors M3 and M4, and the ground line that is always kept at the ground potential is connected to the sources thereof. This enables the potential of the gates to be always equal to or higher than the potential of the sources, so that a constant direction of the gate-source voltage can always be maintained.

On the other hand, in the first embodiment, the clock signal $\phi_b$ having a high level potential or a ground potential is input to the gates of the MIS transistors M3 and M4, and the clock signal $\phi_c$ having a high level potential or a ground potential is input to the sources thereof. Since the clock signals $\phi_b$ and $\phi_c$ have different phases, the direction of the gate-source voltage varies over time and does not always remain in the same direction. The reliability of the MIS transistors M3 and M4 is thus improved.

The clock signals $\phi_a$, $\phi_b$, and $\phi_c$ are supplied from a clock generation circuit 4a formed on a TCP 4 to the gate driver (shift register) 3. Source drivers 5 drive the signal lines 2b within the display area 2. The shift register according to the first embodiment may be implemented as a source driver of the display.

For example, if the display is a 6-inch VGA panel, the gate driver (shift register) 3 which drives the scan lines 2a has 480 stages. According to the first embodiment, since the stages of the shift register are divided into groups each consisting of six stages, 480 stages are divided into 80 groups each consisting of six stages. Thus, the length of the clock signal lines in each group is reduced to 1/80 length of clock signal lines when the stages are not divided into groups. The line capacitance and the line resistance of the clock signal lines in each group are also reduced to 1/80. Then, the delay of the clock signals, which is determined by substantially multiplying the line capacitance by the line resistance, is reduced to 1/6400.

Figure 5:
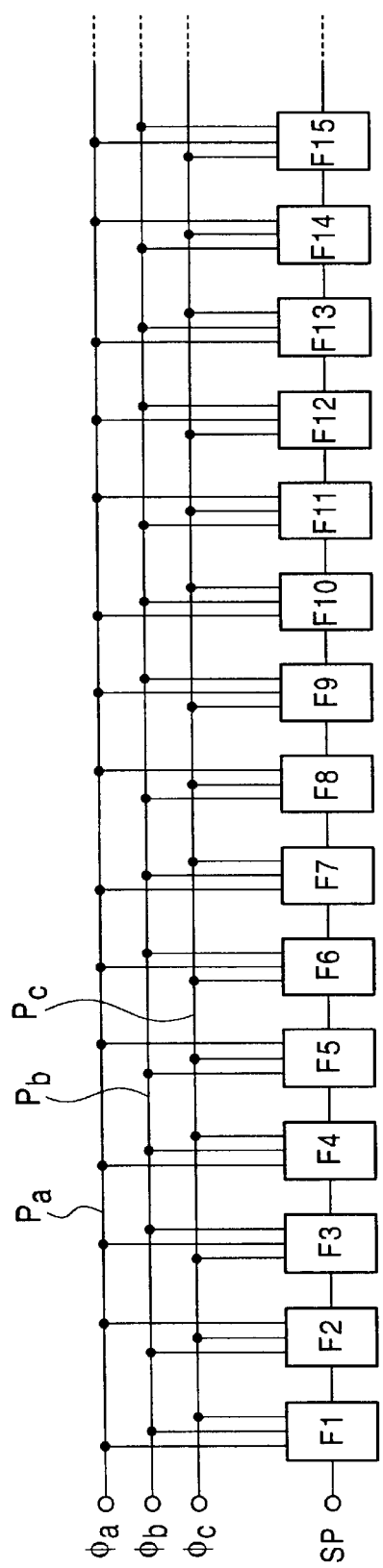
FIG. 5 is an overall view of a shift register according to a second embodiment of the present invention.

FIG. 5 is an overall view of a shift register according to a second embodiment of the present invention. The internal circuitry of stages F1, F2, F3, and the like in the shift register is the same as in the first embodiment. In the second embodiment, the stages F1, F2, F3, and the like in the shift register are not divided into blocks, and the clock signals $\phi_a$, $\phi_b$, and $\phi_c$ are supplied to each stage via clock signal lines $P_a$, $P_b$, and $P_c$ of a single system. If it is possible that the clock signal lines $P_a$, $P_b$, and $P_c$ are made of a material having sufficiently small line capacitance or line resistance, the structure of the second embodiment would be achieved. This structure requires fewer terminals (clock input terminals) connected to external components, thereby making the production process simplified, while improving the reliability.

Figure 6:
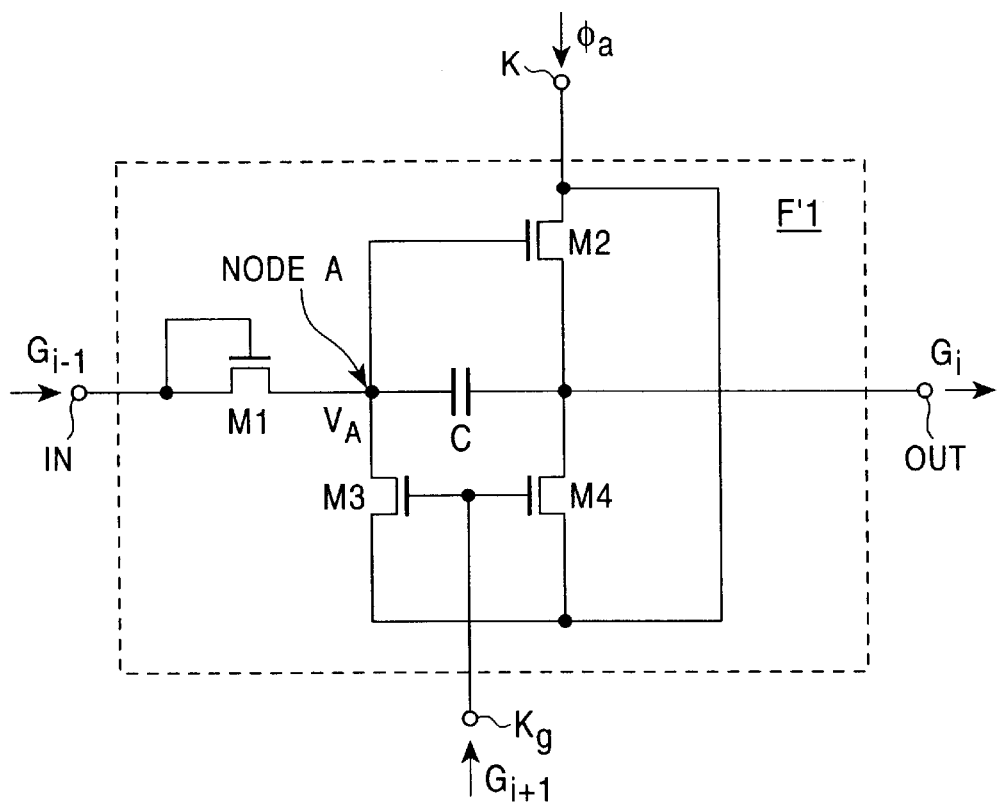
FIG. 6 is a circuit diagram which illustrates the internal circuitry of a stage F'1 incorporated in a shift register according to a third embodiment of the present invention.

FIG. 6 is a circuit diagram which illustrates the internal circuitry of a stage F'1 incorporated in a shift register according to a third embodiment of the present invention. In FIG. 6, the same reference numerals are assigned to the same components of the stage F1 shown in FIG. 1, and the description thereof is omitted. The stage F'1 in the third embodiment has a terminal $K_g$ at which a signal $G_{i+1}$ output from the next stage is input. The terminal $K_g$ is connected to the gates of the MIS transistors M3 and M4. The stage F'1 uses only one clock input terminal K as the clock input terminal. One clock signal $\phi_a$ of the two-phase clock signals $\phi_a$ and $\phi_b$ is input to the clock input terminal K. The clock input terminal K is connected to the drain of the MIS transistor M2, and is further connected to the sources of the MIS transistors M3 and M4.

Figure 7:
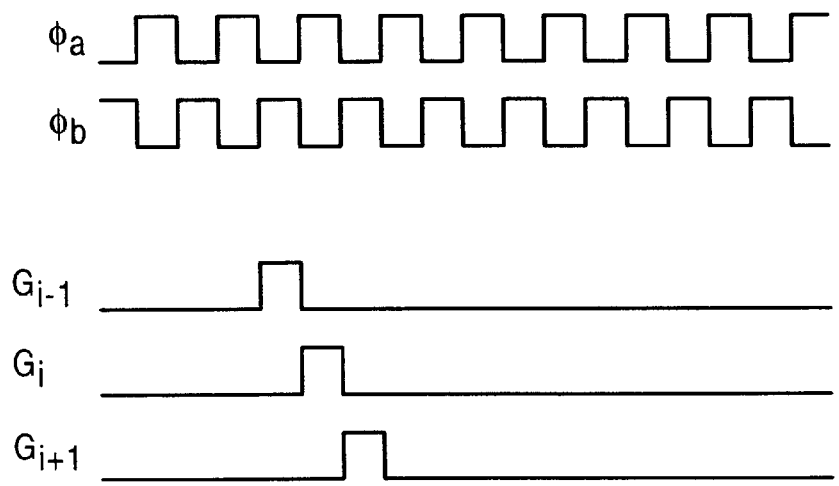
FIG. 7 is a timing chart of the stage F'1 shown in FIG. 6.

FIG. 7 is a timing chart of the stage F'1 shown in FIG. 6. The stage F'1 receives one of the two-phase clock signals $\phi_a$ and $\phi_b$, i.e., the clock signal $\phi_a$, and the signal $G_{i+1}$ output from the next stage, and works similarly to the stage F1 according to the first embodiment.

Figure 8:
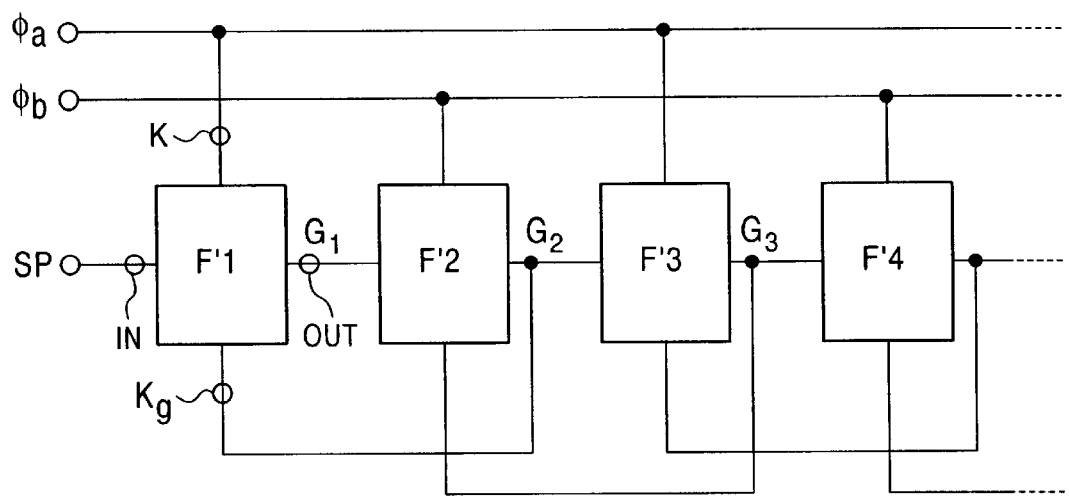
FIG. 8 is an overall view of the shift register according to the third embodiment.

FIG. 8 is an overall view of the shift register according to the third embodiment. The shift register is formed of a plurality of stages F'1, F'2, F'3, and the like, and the two-phase clock signals $\phi_a$ and $\phi_b$ are alternately input to the stages F'1, F'2, F'3, and the like in turn. For example, the clock signal $\phi_a$ is input to the stage F'1, and the clock signal $\phi_b$ is input to the stage F'2. A signal output from the next stage is input to the terminal $K_g$ of each of the stages F'1, F'2, F'3, and the like. For example, a signal $G_2$ output from the next stage F'2 is input to the terminal $K_g$ of the stage F'1. This structure only requires the two-phase clock signals $\phi_a$ and $\phi_b$ to drive the shift register, thereby further reducing the number of lines in the shift register, while simplifying the clock generation circuit.

Figure 9:
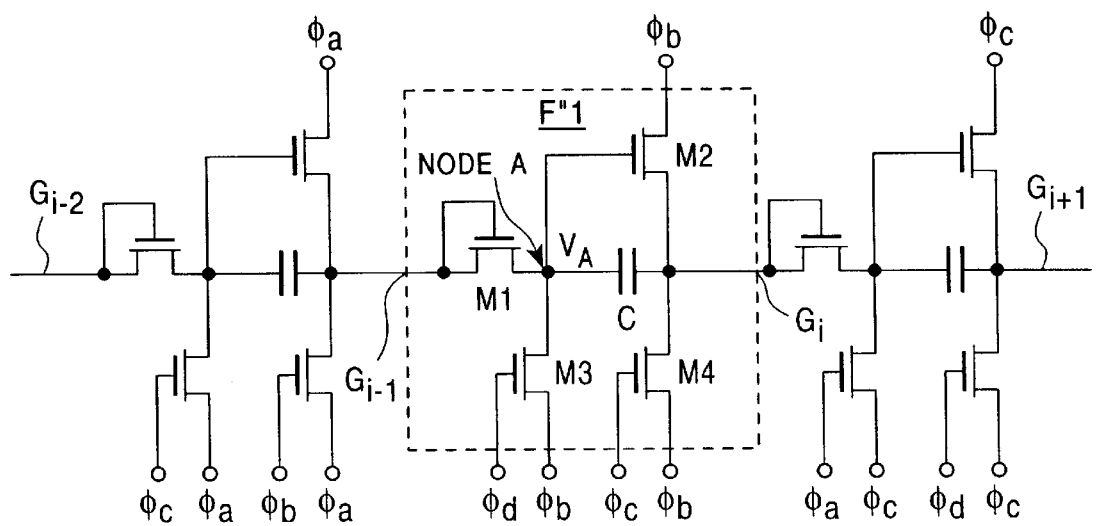
FIG. 9 is an overall view of a shift register according to a fourth embodiment of the present invention.

FIG. 9 is an overall view of a shift register according to a fourth embodiment of the present invention. Three out of four-phase clock signals $\phi_a$, $\phi_b$, $\phi_c$, and $\phi_d$ are supplied to each stage in the shift register. For example, the clock signals $\phi_b$, $\phi_c$, and $\phi_d$ are supplied to a stage F"1.

Figures 10, 11:
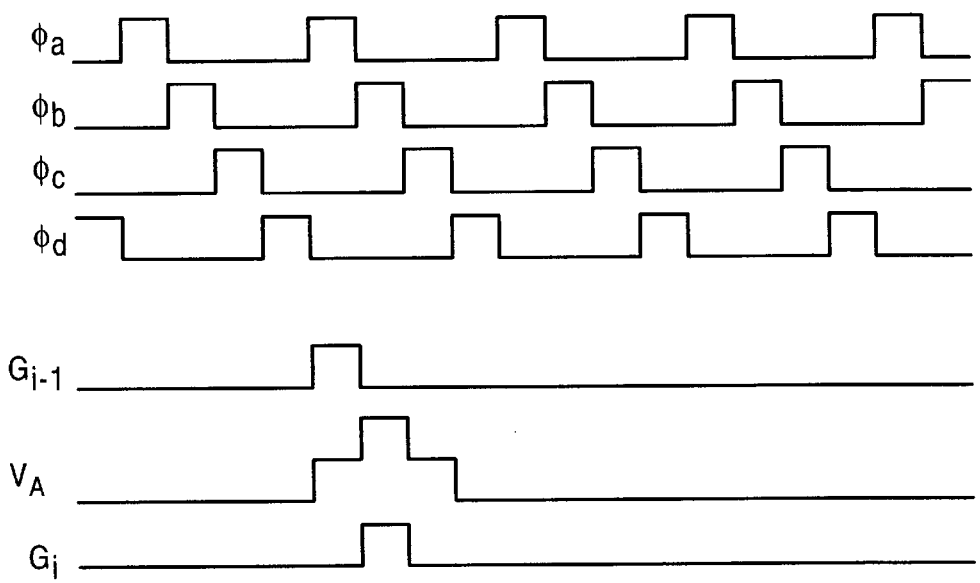
FIG. 10 is a timing chart of a stage F"1 incorporated in the shift register according to the fourth embodiment.
FIG. 11 is a comparative table which illustrates the effect of reducing a delay with respect to the clock signals in the display.

FIG. 10 is a timing chart of the stage F"1 shown in FIG. 9. The stage F"1 receives three of the four-phase clock signals $\phi_a$, $\phi_b$, $\phi_c$, and $\phi_d$, i.e., the clock signals $\phi_b$, $\phi_c$, and $\phi_d$, and works similarly to the stage F1 according to the first embodiment.

FIG. 11 is a comparative table which illustrates the effect of reducing a delay with respect to the clock signals in the display. It is assumed that the display is a 6-inch VGA panel, and a gate driver (shift register) for driving scan lines has 480 stages with the overall length of approximately 91 mm. It is further assumed that the line material has a sheet resistance of 1 Ω per square, the parasitic capacitance (per unit width) of the gates of the TFTs is $2 \times 10^{(-11)}$ F/cm, and the MIS transistors M1, M2, and M4 each have a TFT dimension (W/L) of (600 $\mu$m/3 $\mu$m), and the MIS transistor M3 has a TFT dimension (W/L) of (1500 $\mu$m/3 $\mu$m). In the first, second, and third embodiments of the present invention, in comparison with the conventional shift register, the number of lines decreases, and the line capacitance C and the line resistance R are reduced.

In FIG. 11, the line capacitance C and the line resistance R in the first and third embodiments represent values in each group consisting of six stages. With respect to the line width in the first and third embodiments, the minimum line width is typically 3 to 10 $\mu$m due to the process limitation.

Figure 12:
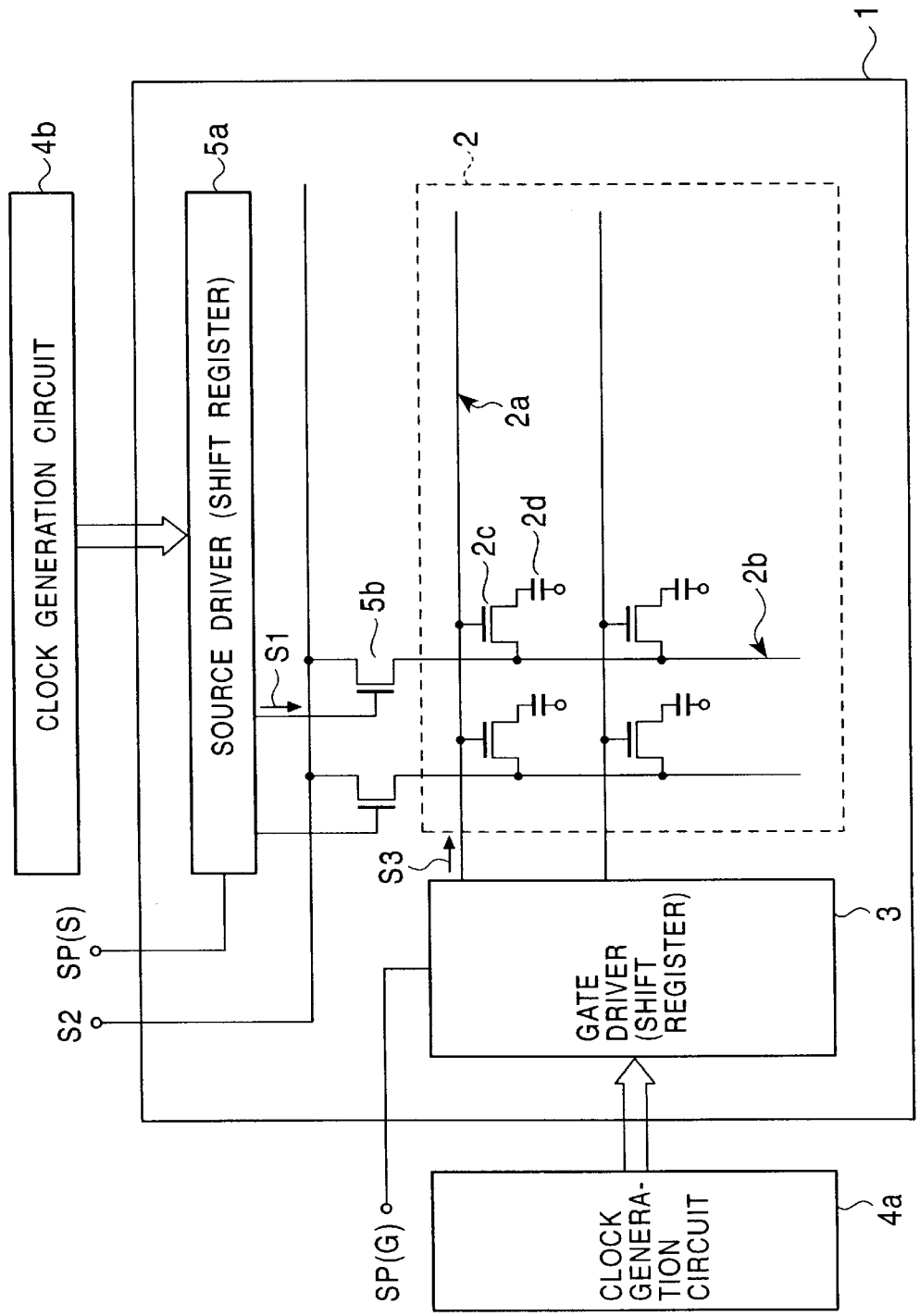
FIG. 12 is a schematic view of a display in an embodiment of the present invention which uses the shift register in accordance with the present invention as a gate driver or a source driver.

FIG. 12 is a schematic view of a display in an embodiment of the present invention which uses the shift register in accordance with one of the illustrated embodiments as a gate driver or a source driver. In the display, a clock signal output by a clock generation circuit 4a is supplied to a gate driver 3 formed on a TFT substrate (display substrate) 1, and the gate driver 3 drives scan lines 2a within a display area 2. A clock signal output by a clock generation circuit 4b is supplied to a source driver 5a formed on the TFT substrate (display substrate) 1 to apply scan signals S1 output by the source driver 5a to the gates of transistors 5b. The transistors 5b turn on or off the supplying of a source signal S2 to signal lines 2b within the display area in response to the scan signals S1.

The shift register according to the present invention may be implemented as the gate driver 3 which supplies scan signals S3 to the scan lines 2a, and may also be implemented as the source driver 5a which applies the scan signals S1 to the gates of the transistors 5b.

Figure 13:
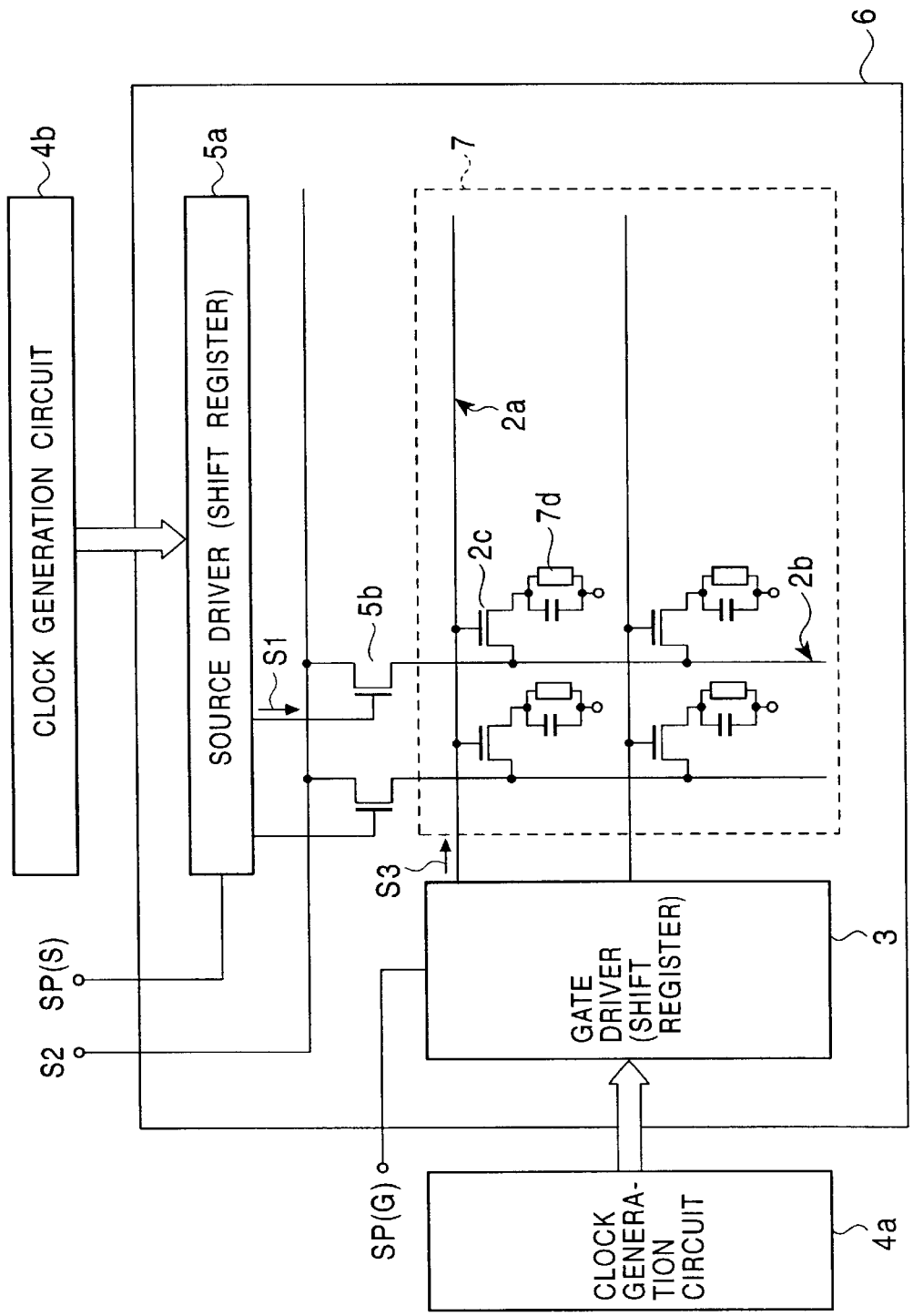
FIG. 13 is a schematic view of an image sensor which uses the shift register in accordance with the present invention as a gate driver or a source driver.
Figure 14:
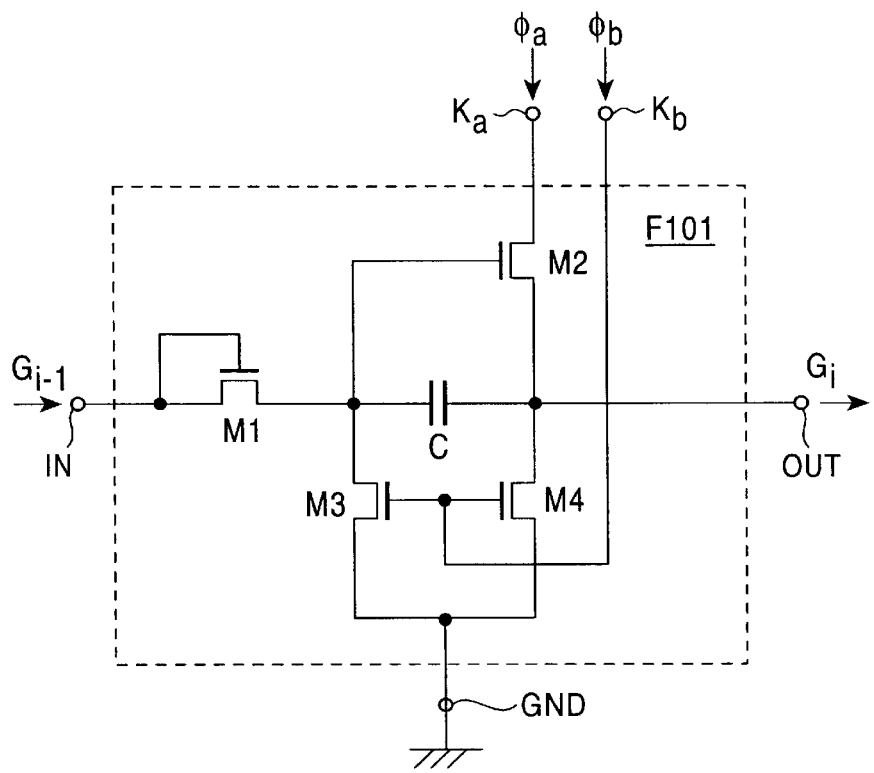
FIG. 14 is a circuit diagram which illustrates the internal circuitry of a stage F101 incorporated in a conventional exemplary shift register.
Figure 15:
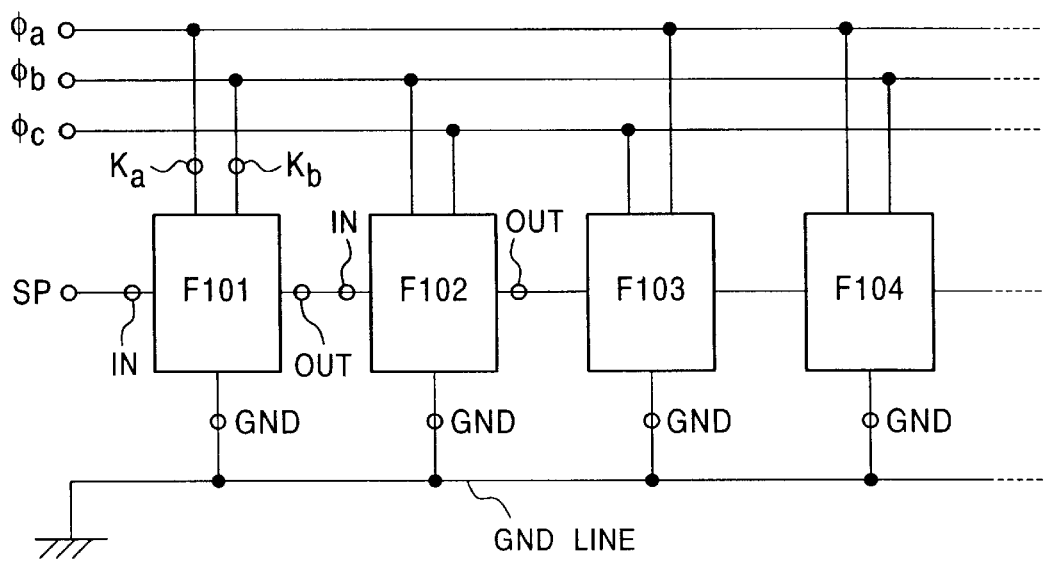
FIG. 15 is an overall view of the conventional shift register.

FIG. 13 is a schematic view of an image sensor using the shift register in accordance with the present invention as a gate driver or a source driver. The image sensor includes photo detectors 7d in a sensor area 7 formed on a TFT substrate (image sensor substrate) 6 in place of display elements 2d in the display area 2 on the TFT substrate (display substrate) 1 shown in FIG. 12. The structure of other components is the same as that in the display shown in FIG. 12.

While the present invention has been described through illustration of its preferred forms, it is to be understood that the described embodiments are only illustrative and various changes and modifications may be imparted thereto without departing from the scope of the present invention which is limited solely by the appended claims.

What is claimed is:

1. A shift register having m stages which store any one of two states, where m is an integer more than 1, each stage comprising, as terminals:

clock input terminals at which n-phase clock signals are input, where n is an integer more than 1;

an input terminal in which a signal is received from either an input terminal of the shift register or from an output terminal of a previous stage; and an output terminal in which a signal is output to either an input terminal of a subsequent stage or an output terminal of the shift register, wherein said each stage receives an initial state level comprising a time varying signal that varies from a low or ground potential to a high potential from any one of said clock input terminals, the initial state level being used to initialize a state of said each stage without relying on a continuous ground line or a continuous low potential line.

2. A shift register according to claim 1, wherein the stages of the shift register are divided into a plurality of groups, and in-phase clock input terminals of the stages in each group are all connected to each other.

3. A shift register according to claim 2, said each stage comprising:

a storage mechanism to store any one of the two states; and an initializing mechanism to initialize a state stored by said storage mechanism to the initial state level input from any one of said clock input terminals.

4. A shift register according to claim 3, wherein said initializing mechanism comprises a metal-insulator-semiconductor (MIS) transistor, and MIS transistors contained in said each stage, including said MIS transistor, are MIS transistors of the same channel type.

5. A shift register according to claim 4, wherein the MIS transistors comprise one of amorphous silicon and polycrystalline silicon.

6. A shift register according to claim 5, wherein the outputs of the stages in the shift register correspond to scan signals of an active matrix circuit having switching elements formed at intersections between signal lines and scan lines, and MIS transistor contained in the active matrix circuit, and the MIS transistors contained in said each stage constituting the shift register are MIS transistors of the same channel type, and comprise one of amorphous silicon and polycrystalline silicon.

7. A shift register according to claim 6, wherein the shift register is formed together with the active matrix circuit on the same substrate.

8. A shift register according to claim 4, where in the outputs of the stages in the shift register correspond to scan signals of an active matrix circuit having switching elements formed at intersections between signal lines and scan lines, and MIS transistor contained in the active matrix circuit, and the MIS transistors contained in said each stage constituting the shift register are MIS transistors of the same channel type, and comprise one of amorphous silicon and polycrystalline silicon.

9. A shift register according to claim 8, wherein the shift register is formed together with the active matrix circuit on the same substrate.

10. A shirt register according to claim 1, said each stage comprising:
- a storage mechanism to store any one of the two states; and
- an initializing mechanism to initialize a state stored by said storage mechanism to the initial state level input from any one of said clock input terminals.

11. A ship register according to claim 10, wherein said initializing mechanism comprises an MIS transistor, and MIS transistors contained in said each stage, including said MIS transistor, are MIS transistors of the same channel type.

12. A shift register according to claim 11, wherein the MIS transistors comprise one of amorphous silicon and polycrystalline silicon.

13. A shift register according to claim 12, wherein the outputs of the stages in the shift register correspond to scan signals of an active matrix circuit having switching elements formed at intersections between signal lines and scan lines, and MIS transistors contained in the active matrix circuit, and the MIS transistors contained in said each stage constituting the shift register are MIS transistors of the same channel type, and comprise one of amorphous silicon and polycrystalline silicon.

14. A shift register according to claim 13, wherein the shift register is formed together with the active matrix circuit on the same substrate.

15. A shift register according to claim 11, wherein the outputs of the stages in the shift register correspond to scan signals of an active matrix circuit having switching elements formed at intersections between signal lines and scan lines, and MIS transistors contained in the active matrix circuit, and the MIS transistors contained in said each stage constituting the shift register are MIS transistors of the same channel type, and comprise one of amorphous silicon and polycrystalline silicon.

16. A shift register according to claim 15, wherein the shift register is formed together with the active matrix circuit on the same substrate.

17. A display using a shift register according to claim 1 as a gate driver.

18. A display using a shift register according to claim 1 as a source driver.

19. A shift register having m stages which store any one of two states, where m is an integer greater than 1, each stage comprising:
- clock input terminals at which n-phase clock signals are received, where n is an integer greater than 1;
- an input terminal of a current stage coupled to either an output terminal of a previous stage or an input terminal of the shift register; and
- an output terminal of the current stage coupled to either an input terminal of a subsequent stage or an output terminal of the shift register;
- wherein each of said stages receives a time varying signal having a magnitude that alternates between a low or a ground potential to a high potential from one of said clock input terminals that initializes each of said stages of said shift register without relying on a continuous low potential.

20. A shift register according to claim 19, wherein n is greater than 2.

* * * * *

UNITED STATES PATENT AND TRADEMARK OFFICE
CERTIFICATE OF CORRECTION

PATENT NO. : 6,621,886 B2
DATED : September 16, 2003
INVENTOR(S) : Ken Kawahata

It is certified that error appears in the above-identified patent and that said Letters Patent is hereby corrected as shown below:

Column 8,
Lines 47 and 60, delete "transistor" and substitute -- transistors -- in its place.
Line 55, delete "where in" and substitute -- wherein -- in its place.

Signed and Sealed this

Thirtieth Day of December, 2003

JAMES E. ROGAN
*Director of the United States Patent and Trademark Office*